United States Patent
Fukumoto et al.

(10) Patent No.: US 8,327,663 B2
(45) Date of Patent: Dec. 11, 2012

(54) METHOD OF MANUFACTURING AN OPTICAL GLASS ELEMENT

(75) Inventors: Naoyuki Fukumoto, Tokyo (JP); Shunichi Hayamizu, Tokyo (JP)

(73) Assignee: Konica Minolta Opto, Inc. (JP)

( * ) Notice: Subject to any disclaimer, the term of this patent is extended or adjusted under 35 U.S.C. 154(b) by 45 days.

(21) Appl. No.: 12/567,502

(22) Filed: Sep. 25, 2009

(65) Prior Publication Data

US 2010/0064727 A1  Mar. 18, 2010

Related U.S. Application Data

(62) Division of application No. 11/300,733, filed on Dec. 15, 2005, now abandoned.

(30) Foreign Application Priority Data

Dec. 21, 2004  (JP) ................. 2004-368888

(51) Int. Cl.
C03B 40/00 (2006.01)
C03B 40/02 (2006.01)
C03B 11/00 (2006.01)
(52) U.S. Cl. ..................... 65/26; 65/24; 65/68
(58) Field of Classification Search .......... 65/24, 374.11
See application file for complete search history.

(56) References Cited

U.S. PATENT DOCUMENTS

| | | | |
|---|---|---|---|
| 5,284,501 A * | 2/1994 | Monji et al. ............. 65/32.5 |
| 5,380,349 A | 1/1995 | Taniguchi et al. | |
| 5,964,916 A | 10/1999 | Segawa et al. | |
| 6,119,485 A | 9/2000 | Hibino et al. | |
| 2003/0192348 A1 | 10/2003 | Kudoh et al. | |

FOREIGN PATENT DOCUMENTS

| | | | |
|---|---|---|---|
| JP | 04-260619 | | 9/1992 |
| JP | 05097449 A | * | 4/1993 |
| JP | 10-330123 | | 12/1998 |
| JP | 2000044258 A | * | 2/2000 |
| JP | 02-074531 | | 4/2000 |
| JP | 2000-327344 | | 11/2000 |
| JP | 2000327344 A | * | 11/2000 |
| JP | 2001-089181 | | 4/2001 |
| JP | 2002-020129 | | 1/2002 |
| JP | 2002-097028 | | 4/2002 |
| JP | 2002-255568 | | 9/2002 |
| JP | 2002338267 A | * | 11/2002 |

OTHER PUBLICATIONS

JP 05097449A Derwent abstract.*
JP 05097449A JPO abstract.*
JP 05097449A Derwent Abstract. Apr. 1993 (Correction of entry in 892 mailed Feb. 15, 2012).*
JP 05097449A JPO Abstract. Apr. 1993 (Correction of entry in 892 mailed Feb. 15, 2012).*

* cited by examiner

Primary Examiner — Matthew Daniels
Assistant Examiner — Cynthia Szewczyk
(74) Attorney, Agent, or Firm — Brinks Hofer Gilson & Lione

(57) ABSTRACT

A substrate protective film composed of chromium metal is formed on a molding surface of a mold base material composed of cemented carbide. The substrate protective film is oxidized by heat treatment or ion implantation, so that a surface protective film composed of chromium oxide is formed. A pair of molds having such a constitution are prepared. Softened glass is pressed between the surface protective films of the paired molds, so that optical glass elements are molded.

4 Claims, 5 Drawing Sheets

METHOD OF MANUFACTURING AN OPTICAL GLASS ELEMENT

CROSS-REFERENCE TO RELATED APPLICATIONS

The present application is a division of U.S. application Ser. No. 11/300,733, filed Dec. 15, 2005, now abandoned which claims priority to Japanese Patent Application No. 2004-368888 filed on Dec. 21, 2004, the entire content of which is hereby incorporated by reference.

The present application claims priority to Japanese Patent Application No. 2004-368888 filed on Dec. 21, 2004, the entire content of which is hereby incorporated by reference

BACKGROUND OF THE INVENTION

1. Field of the Invention

The present invention relates to a mold which is used for forming optical glass and an optical glass element molded by the mold.

2. Description of the Related Art

In recent years, for example, after molten optical glass gob is supported by molds, it is immediately press-molded, so that optical glass elements such as lenses are manufactured. Since such glass molding is normally performed in high-temperature air, oxidation of the molds extends. When the molds are oxidized, the molding surfaces of the molds become rough, and thus mirror plane properties are deteriorated or the optical glass is fused onto the molding surfaces. As a result, release characteristics are deteriorated, and thus the life of the molds becomes short.

Various efforts are made for lengthening the life of the molds. For example, Japanese Patent Application Laid-Open No. 4-260619 discloses a mold whose molding surface is coated with a film made of chromium metal (Cr) in order to protect the molding surface of a mold base material. Since the mold which is coated with the chromium metal (Cr) thin film has the chromium metal (Cr) film with low hardness, shock resistance and wear resistance with respect to glass are inferior. The release characteristics are not satisfactory in some types of glass to be molded. Further, Japanese Patent Application Laid-Open No. 2-74531 discloses that after a molding surface is coated with a chromium nitride (CrN or $Cr_2N$) film in order to protect the molding surface of a mold base material, the molding surface is subject to heat treatment in an atmosphere including oxygen, and a chromium trioxide film is formed on the top surface. The chromium nitride film is normally composed of a nonstoichiometric compound including Cr and N such as CrN and $Cr_2N$, and thus it is difficult to manufacture a film including only CrN. The chromium nitride film is formed by physical and/or chemical film deposition method(s) such as sputtering, ion plating and CVD. With these film deposition methods, after source materials of chromium nitride are once separated, a chromium nitride compound is formed. For this reason, the composition has defects such that a desired composition cannot be obtained, or the composition is locally dispersed.

SUMMARY OF THE INVENTION

It is a main object of the present invention to provide a long-lived mold for molding optical glass that has excellent release characteristics, shock resistance, wear resistance, oxidation resistance and mirror plane properties.

It is another object of the present invention to provide a manufacturing method that enables manufacturing of optical glass elements with high accuracy at low price.

In order to attain these objects and other objects, from a certain aspect of the present invention, a mold for molding optical glass includes:
a mold base material;
a substrate protective film composed of chromium metal formed on a molding surface of the mold base material; and
a surface protective film composed of chromium oxide formed on the substrate protective film.

Further, from another aspect of the present invention, a method of manufacturing optical glass element includes:
the step of preparing a pair of molds including a mold base material, a substrate protective film composed of chromium metal formed on a molding surface of the mold base material, and a surface protective film composed of chromium oxide formed on the substrate protective film; and
the step of pressing glass using the paired molds.

The invention itself, together with further objects and attendant advantages, will best be understood by reference to the following detailed description.

BRIEF DESCRIPTION OF THE DRAWINGS

In the following description, like parts are designated by like reference numbers throughout the several drawing.

DETAILED DESCRIPTION OF THE PREFERRED EMBODIMENTS

A mold for molding optical glass and an optical glass element according to an embodiment of the present invention are explained below with reference to FIGS. 1 to 5. The mold for molding optical glass is also applicable to the case where a glass material which is previously processed into a predetermined shape is again heated in air or in a non-oxidizing atmosphere and is press-molded.

Figure 1A:
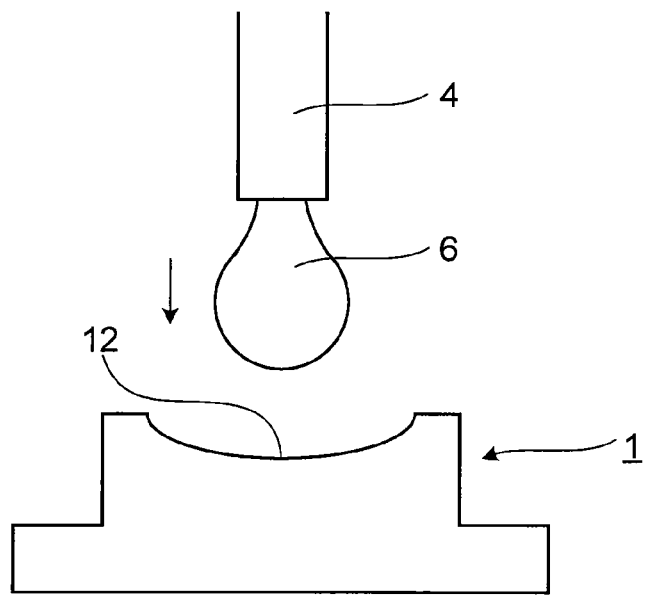
FIGS. 1A to 1C are diagrams schematically illustrating states that press-molding is performed by using a mold for molding optical glass.
Figure 1B:
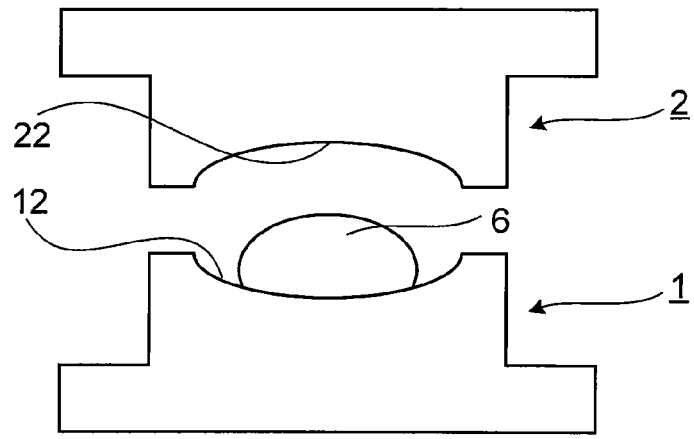
Figure 1C:
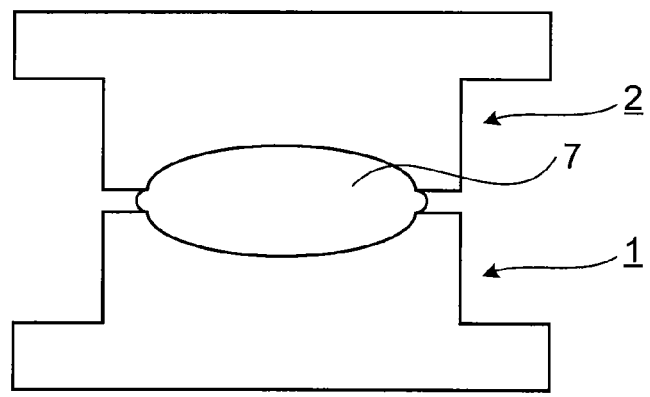
Figure 2:
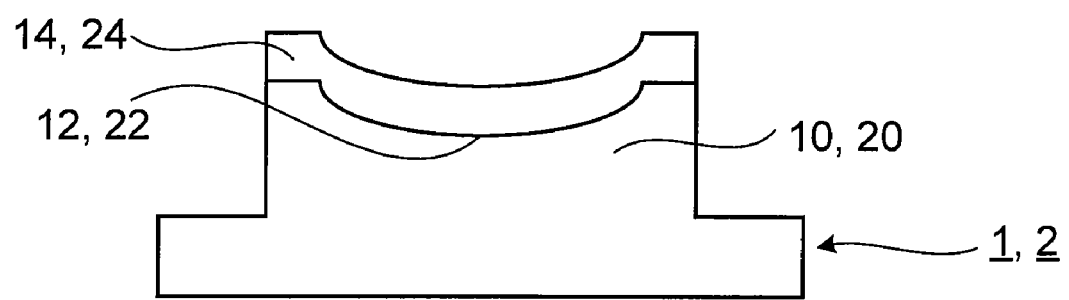
FIG. 2 is a diagram illustrating a step of manufacturing the mold for molding the optical glass according to an embodiment of the present invention.
Figure 3:
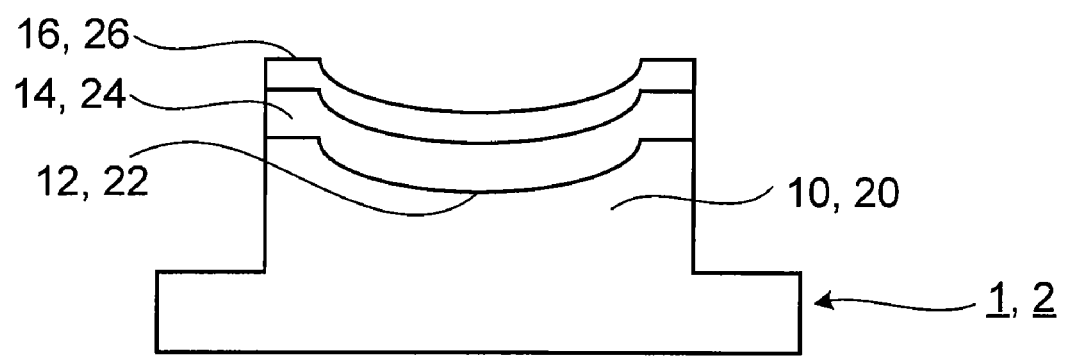
FIG. 3 is a diagram schematically illustrating the mold for molding optical glass according to the embodiment of the present invention.
Figure 4:
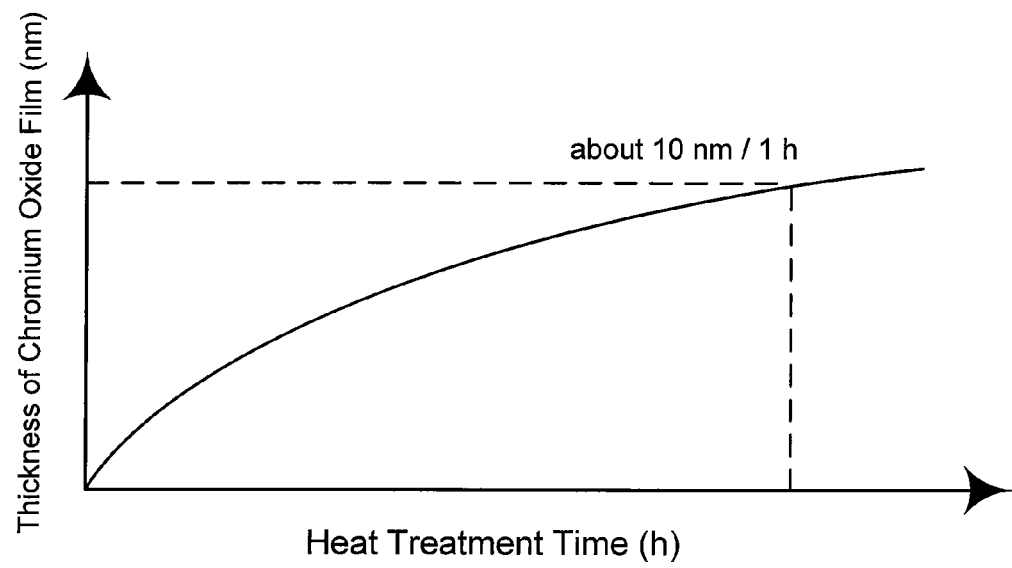
FIG. 4 is a diagram illustrating a relationship between heat treatment time and a thickness of a chromium oxide film.
Figure 5:
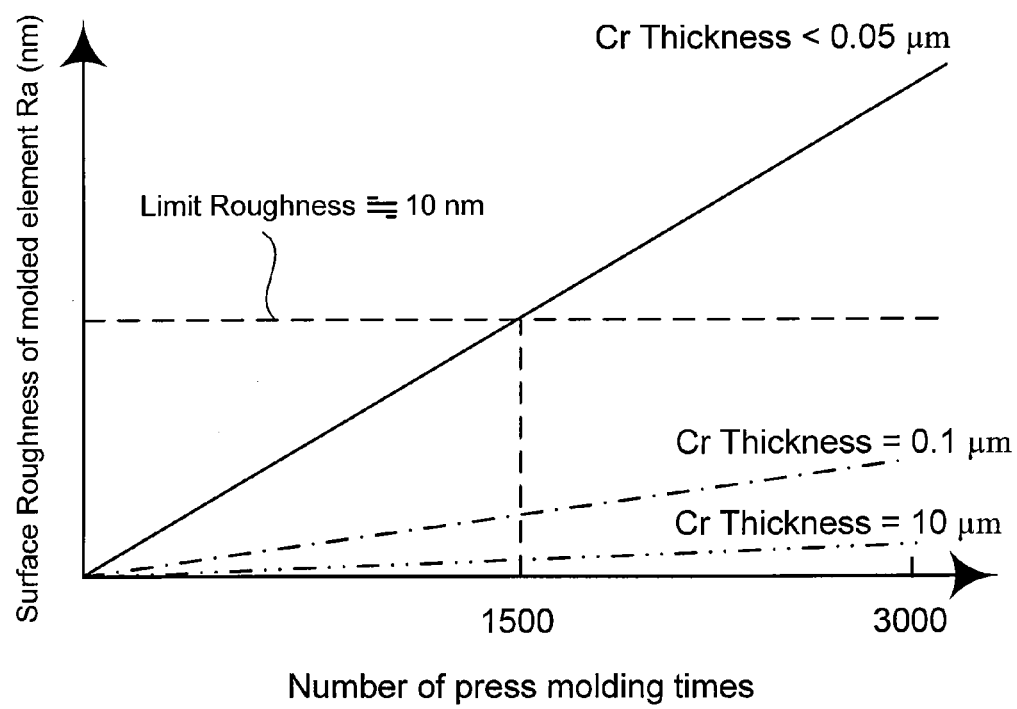
FIG. 5 is a diagram illustrating a relationship between the number of press-molding times and surface roughness of a molded optical glass element.

FIGS. 1A to 1C are diagrams for schematically explaining states that an optical glass element is press-molded by using the mold for molding optical glass. FIG. 2 is a diagram explaining a step of manufacturing the mold for molding optical glass according to the embodiment of the present invention. FIG. 3 is a pattern diagram of the mold for molding optical glass according to the embodiment of the present invention. FIG. 4 is a diagram illustrating a relationship between heat treatment time and a thickness of a chromium oxide film. FIG. 5 is a diagram illustrating a relationship between the number of press-molding times and surface roughness of optical glass element.

Various kinds of optical glass elements 7 such as a lens and a prism are manufactured by a method shown in FIGS. 1A to 1C. As shown in FIG. 1A, molten glass 6 is dropped from an end of a nozzle 4 extending from a molten tank which stores the molten glass 6 so as to be received by a lower mold 1. As shown in FIG. 1B, an upper mold 2 is dropped with respect to the lower mold 1 placed on the molten glass 6, so that the molten glass 6 is compression-molded by the lower mold 1 and the upper mold 2. As a result, the optical glass element 7 shown in FIG. 1C can be obtained. Such a series of the press molding is performed in an atmosphere including oxygen.

As the molds for molding optical glass 1 and 2 to be used for the press molding, various types of ones, mentioned later, are considered. The molds for molding optical glass 1 and 2 are roughly composed of mold base materials 10 and 20 whose molding surfaces 12 and 22 are subject to mirror plane finishing into a predetermined shape, and protective films formed on the molding surfaces 12 and 22. As the mold base materials 10 and 20, excellent mechanical characteristics, heat resistance, oxidation resistance and the like are required, and thus cemented carbide, stainless, ceramic and the like are used. Further, it is required that the protective films have excellent shock resistance, wear resistance, release characteristics, oxidation resistance and the like. Chromium metal films (substrate protective films) 14 and 24 are formed on the molding surfaces 12 and 22 of the mold base materials 10 and 20 according to various conditions, mentioned later, and chromium oxide films (surface protective films) 16 and 26 are further formed thereon, so that the protective film are manufactured.

[First Embodiment]

The mold base materials 10 and 20 composed of a pair of cemented carbides are subject to the mirror plane finishing with high accuracy, and the molding surfaces 12 and 22 having a concave shape shown in FIG. 2 are manufactured. The chromium metal films 14 and 24 as the substrate protective films were formed on the molding surfaces 12 and 22. The chromium metal films 14 and 24 were deposited by a sputtering method according to deposition conditions A shown in Table 1. In the sputtering method, since energy of particles forming the thin film is generally several dozen eV which is very large, a force of adhesion to a substrate is stronger than that in the vacuum deposition method or the like. The chromium metal films 14 and 24 as the substrate protective films formed by the sputtering method, therefore, firmly adheres to the mold base materials 10 and 20.

TABLE 1

| Film deposition conditions of chromium metal film | | | |
|---|---|---|---|
| | A | B | C |
| Substrate temperature (° C.) | 100-300 | 100-300 | 100-300 |
| High-frequency power (W) | 500 | 500 | 500 |
| Ar gas pressure (Pa) | 0.4 | 0.4 | 0.4 |
| Oxygen gas pressure (Pa) | | 0.067 | |
| Nitrogen gas pressure (Pa) | | | 0.067 |

The molds for molding optical glass 1 and 2 formed with the chromium metal films 14 and 24 were subject to heat treatment in an air atmosphere. The heat treatment was performed under various conditions, but as the temperature of the heat treatment was higher and the heat treatment time was longer, the film thickness of the chromium oxide films 16 and 26 was thicker, and an oxidation degree of chromium (valence of chromium) became larger. As a result of considering various heat treatment conditions, a satisfactory mold was obtained under conditions of 400° C. to 600° C. and 30 minutes to 90 minutes, and as its example, examples A, B and C were shown in Table 2. When the heat treatment temperature is too low, the stable chromium oxide films 16 and 26 are not formed, and when the heat treatment temperature is too high, the chromium oxide films 16 and 26 abruptly grow, thereby causing surface roughness. When the heat treatment time is short, the chromium oxide films 16 and 26 having enough thickness cannot be obtained. FIG. 4 shows a relationship between the time and the thickness of the chromium oxide films 16 and 26 when the chromium metal films 14 and 24 are subject to the heat treatment in an air atmosphere of 500° C. The thickness of the chromium oxide films 16 and 26 increased in approximately proportional to the heat treatment time, and the thickness was about 10 nm by the heat treatment for 1 hour. The thickness of the chromium oxide films 16 and 26 can be estimated by contrasting a change in reflectance with a thin film simulation result. It is preferable that the thickness of the chromium oxide films 16 and 26 is 0.003 to 0.05 μm, and 0.005 to 0.03 μm is more preferable.

The oxidation degree of chromium (valence of chromium) was analyzed by the X-ray photoelectron spectroscopy analysis (XPS), triatomic, tetratomic, pentavalent and hexavalent chrome were included.

As to the molds for molding optical glass 1 and 2 which were subject to the heat treatment, the molten glass 6 was press-molded sequentially 200 times in an air atmosphere according to the molding method shown in FIGS. 1A to 1C, and the release characteristics, the shock resistance and the wear resistance were inspected. The results of the press molding are shown in Table 2.

TABLE 2

| | Experimental results | | | | |
|---|---|---|---|---|---|
| | Top surface of mold | Heat treatment condition | Release Characteristics | Shock resistance and wear resistance | Remarks |
| Example A | Chromium oxide | 400° C., 30 minutes | ○ | ○ | |
| Example B | Chromium oxide | 500° C., 30 minutes | ⊚ | ○ | |
| Example C | Chromium oxide | 500° C., 60 minutes | ⊚ | ⊚ | |
| Example D | Chromium oxide | 400° C., 30 minutes | ○ | ⊚ | Add oxygen |
| Example E | Chromium oxide | 400° C., 30 minutes | ○ | ⊚ | Add nitrogen |
| Comparative example | Chromium metal | None | Δ | Δ | |

The mark ⊚ means that generation of defective release or chip is 0.1% or less. The mark ○ means that the generation of defective release or chip is 0.1% to 0.5%. The mark Δ means that the generation of defective release or chip is 0.5% to 10%. According to Table 2, it is found that in the molds for press molding 1 and 2 in which the chromium metal films 14 and 24 are formed on the mold base materials 10 and 20 are subject to the heat treatment and the chromium oxide films 16 and 26 are formed on the top surface, the release characteristics, the wear resistance and the shock resistance with respect to the molten glass 6 are improved. In the data in document, Vickers' hardness (Hv) of the chromium metallic films and the chromium oxide films is 1000 to 1100 and 1200 to 1300, respectively.

The heat treatment was given to the chromium metal films 14 and 24 in a normal air atmosphere, but the heat treatment can be given in an oxygen-enriched atmosphere where the density of oxygen is higher than that in air.

In the this embodiment, the chromium oxide films 16 and 26 were formed on the top surfaces of the chromium metal films 14 and 24 by the heat treatment in an air atmosphere, but oxygen ions are implanted into the top surfaces of the chromium metal films 14 and 24, so that the chromium metal films 16 and 26 can be formed. As one example, the ions were implanted under conditions that an acceleration energy of the oxygen ions was about 50 keV and ion beam current density was about 50 μA/cm². As a result, the chromium oxide films 16 and 26 were formed on the top surfaces of the molding surfaces 12 and 22. The molten glass 6 was experimentally press-molded similarly to the above manner by using the molds for molding optical glass 1 and 2 formed with the chromium oxide films 16 and 26 by ion implantation. As a result, satisfactory results which were similar to those in the case of the molds for molding optical glass 1 and 2 which were subject to the heat treatment in an air atmosphere could be obtained.

Further, the chromium oxide films 16 and 26 can be formed directly on the top surfaces of the chromium metal films 14 and 24 formed on the mold base materials 10 and 20 by an arbitrary film deposition method (for example, physical and/or chemical film deposition methods such as the sputtering method, the ion plating method, the flame spraying and CVD). At this time, the thickness of the chromium oxide films 16 and 26 is preferably 0.01 to 5 μm, and more preferably 0.05 to 1 μm.

The optimal thickness of the chromium metal films 14 and 24 as the substrate protective films is considered. The situation varies by use environments, but the mold base materials 10 and 20 are normally oxidized under a high-temperature press-molding environment. When the mold base materials 10 and 20 are oxidized, fine unevenness is gradually generated on the molding surface of the accurately processed mirror plane, and the satisfactory molding surfaces cannot be maintained.

A plural types of the molds for press molding 1 and 2 where the thickness of the chromium metal films 14 and 24 varied were produced, and their effects were considered.

[Second Embodiment]

The mold base materials 10 and 20 composed of a pair of cemented carbides are subject to the mirror plane finishing accurately, so that the molding surfaces 12 and 22 having a concave surface shape shown in FIG. 2 are manufactured. The chromium metal films 14 and 24 as the substrate protective films were formed on the molding surfaces 12 and 22. The chromium metal films 14 and 24 are deposited by the sputtering method according to the film deposition condition A shown in Table 1. The chromium metal films 14 and 24 have three kinds of thickness' of less than 0.05 μm, 0.1 μm and 10 μm.

The heat treatment was given to the molds for molding optical glass 1 and 2 formed with the chromium metal films 14 and 24 under conditions such as heat treatment temperature of 500° C., the heat treatment time of 1 hour and an air atmosphere, so that the chromium oxide films 16 and 26 were formed on the top surfaces of the molds for molding optical glass 1 and 2.

In the molds for molding optical glass 1 and 2, the molten glass 6 was sequentially press-molded in air according to the molding method shown in FIGS. 1A to 1C, and the surface roughness of the press-molded optical glass element 7 was measured. FIG. 5 illustrates the result of measuring the surface roughness of the optical glass element 7. As is clear from FIG. 5, in any cases, as the number of the press-molding times increase, the surface roughness of the optical glass element 7 becomes larger, and the surface roughness of the molding surfaces of the molds for molding optical glass 1 and 2 also become larger so that the surface roughness progresses. In the case of the molds for molding optical glass 1 and 2 where the thickness of the chromium metal films 14 and 24 is less than 0.05 μm, the surface roughness of the optical glass element 7 reaches the nondefective limit (JIS01: arithmetical average roughness Ra≈10 nm) when the number of molding times is approximately 1500. On the contrary, when the thickness of the chromium metal films 14 and 24 is 0.1 μm and 10 μm, the speed at which the surface roughens of the optical glass element 7 becomes large is slow, and the life of the molds for molding optical glass 1 and 2 is lengthened.

According to the experimental results, in order to secure the enough number of press-molding times, it is desirable that the thickness of the chromium metal films 14 and 24 is 0.05 μm or more. When the thickness of the chromium metal films 14 and 24 is 15 μm or more, the shape of the molding surfaces 12 and 22 processed into an accurate surface shape is broken, or the chromium metal films 14 and 24 are peeled due to internal stress of the chromium metal films 14 and 24. From such a viewpoint, it is desirable that the thickness of the chromium metal films 14 and 24 is 10 μm or less. As a result, the thickness of the chromium metal films 14 and 24 is preferably 0.05 to 10 μm, and more preferably 0.1 to 1 μm.

Hardening of the chromium metal films 14 and 24 as the substrate protective films was considered. The hardness, namely, mechanical property of the chromium metal films 14 and 24 is inferior to that of the chromium oxide films 16 and 26. Even as the substrate protective films, the superior mechanical properties are advantageous to prevention of chips on the molding surfaces 12 and 22. A plurality of molds for press molding 1 and 2 where impurity was added to the chromium metal films 14 and 24 were, therefore, manufactured, and their effects were considered.

[Third Embodiment]

The mold base materials 10 and 20 composed of a pair of cemented carbides are subject to the mirror plane finishing accurately, so that the molding surfaces 12 and 22 having a concave surface shape shown in FIG. 2 are produced. The chromium metal films 14 and 24 as the substrate protective films were formed on the molding surfaces 12 and 22. The chromium metal films 14 and 24 are deposited by the sputtering method according to the film deposition conditions B and C shown in Table 1. That is to say, a chromium metal target was sputtered by reactive gas where Ar gas included a small amount of oxygen gas or nitrogen gas, so that the chromium metal films 14 and 24 were deposited. In the chromium metal films 14 and 24 manufactured under the film deposition condition B, chromium metal is present as a main component in such a manner that oxygen is present as chromium oxygen or it is taken into a chromium metal crystal lattice. Similarly, in the chromium metal films 14 and 24 manufactured under the film deposition condition C, the chromium metal is present as a main component in such a manner that nitrogen is present as chromium nitrogen or it is taken into a chromium metal crystal lattice.

The heat treatment was given to the molds for molding optical glass 1 and 2 formed with the chromium metal films 14 and 24 including oxygen or nitrogen under conditions such as the heat treatment temperature of 400° C., the heat treatment time of 30 minutes and the air atmosphere, so that the chromium oxide films 16 and 26 were formed on the top surfaces of the molds for molding optical glass 1 and 2.

As to the molds for molding optical glass 1 and 2, the molten glass 6 was sequentially press-molded 200 times in air according to the molding method shown in FIGS. 1A to 1C, and the release characteristics, the shock resistance and the wear resistance were checked. The press-molded results are shown as an example D and an example E in Table 2.

According to Table 2, in the molds for molding optical glass 1 and 2 (the examples D and E) which were formed with the chromium metal films 14 and 24 including oxygen or nitrogen, the shock resistance and the wear resistance were improved further than those of the molds for molding optical glass 1 and 2 (example A) having the chromium metal films 14 and 24 not including impurities. That is to say, the improvement of the mechanical properties in the chromium metal films 14 and 24 as the substrate protective films was effective for preventing chips on the chromium oxide films 16 and 26 as the top surfaces.

The above embodiments have the substrate protective films composed of chromium metal formed on the molding surfaces of the mold base materials, and the surface protective films composed of chromium oxide formed on the substrate protective films. Since the substrate protective films composed of chromium metal which cover the molding surfaces of the mold base materials are composed of a chromium metal element, the substrate protective films having uniform composition can be obtained. The substrate protective films composed of chromium metal have excellent adhesion properties with respect to the mold base materials and dense properties which prevents oxygen from passing therethrough. The molding surfaces, therefore, do not become rough due to oxidation of the mold base materials. Further, in the surface protective films composed of chromium oxide formed on the substrate protective films composed of chromium metal, since standard energy of formation has a large negative value, the films are hardly produce a compound with another elements. For this reason, the release characteristics with respect to glass is excellent. Additionally, since the surface protective films composed of chromium oxide are hard, the shock resistance and the wear resistance are excellent. The molds having the above constitution have all properties such as the release characteristics, the shock resistance, the wear resistance, the oxidation resistance and the mirror plane properties which are required as the molds for molding optical glass. The above protective films can be naturally manufactured so as to have a double-layered structure where after the substrate protective films are formed, the surface protective films are further formed thereon. Since, however, a discontinuous bound is formed between the surface protective films and the substrate protective films, the double-layered structure of the protective films is not much preferable for the adhesion properties. It is, therefore, preferable that the surface protective films are manufactured by giving the oxidation treatment to the chromium metal as the substrate protective films. That is to say, it is preferable that some parts of the top surfaces of the substrate protective films composed of chromium metal are reformed into the surface protective films composed of chromium oxide. The chromium metal on the top surfaces of the surface protective films is partially oxidized into chromium oxide as the substrate protective films so as to change continuously without providing an interface between the surface protective films and the substrate protective films. For this reason, the adhesion properties between the substrate protective films and the surface protective films are excellent. The oxidation treatment is such that heat treatment is carried out in an atmosphere including oxygen or oxygen ion is implanted and chromium metal is changed into chromium oxide. The substrate protective films mainly contribute to the adhesion properties with respect to the mold base materials and prevention of oxidation of the mold base materials. When the thickness of the substrate protective films is too thick, the shape of the accurately processed molding surfaces is broken or the protective films are peeled due to internal stress of the films. On the contrary, when the thickness of the substrate protective films is too thin, the oxidation of the mold base materials progresses quickly, and thus the molding surfaces of the mold base materials, eventually, the protective films become rough. It is, therefore, preferable that the thickness of the substrate protective films is 0.05 to 10 μm. Since the molds for molding optical glass can be used for a long time even in an air atmosphere including oxygen, the production cost of the optical glass elements press-molded by the molds for molding optical glass can be greatly reduced.

An optical plane formed by the molds of the present invention is not limited to a continuous plane such as a spherical plane. The present invention can be applied also to molds for molding a discontinuous optical plane such as a diffracting plane.

COMPARATIVE EXAMPLE

In order to check the effects of the present invention, the molds for molding optical glass 1 and 2 formed with only the chromium metal films 14 and 24 were manufactured by the above similar process. As to the molds for molding optical glass 1 and 2, the molten glass 6 was sequentially press-molded 200 times in an air according to the molding method shown in FIGS. 1A to 1C, so that the release characteristics, the shock resistance and the wear resistance were checked. The result of the press-molding as the comparative example is shown in Table 2. As is clear from Table 2, in the molds for molding optical glass of the comparative example, the release characteristics, the shock resistance and the wear resistance were inferior to those of the molds for molding optical glass 1 and 2 according to the present invention.

Although the present invention has been fully described by way of examples with reference to the accompanying drawings, it is to be noted that various changes and modifications will be apparent to those skilled in the art. Therefore, unless such changes and modification depart from the scope of the present invention, they should be construed as being included therein.

What is claimed is:

1. An optical glass element manufacturing method, comprising the steps of:
    providing a mold having a mold base material;
    forming a substrate protective film composed of chromium metal on a molding surface of the mold base material;
    heating the mold with the substrate protective film in an air atmosphere at 400° C. to 600° C. for 30 to 90 minutes, thereby forming a surface protective film composed of chromium oxide on said substrate protective film, wherein the thickness of the surface protective film is 0.003 μm to 0.050 μm;
    dropping molten optical glass from a nozzle onto the mold; and
    press-molding the molten optical glass on the mold.

2. The optical glass element manufacturing method of claim 1, wherein the thickness of the substrate protective film is 0.05 μm to 10 μm .

3. The optical glass element manufacturing method of claim 2, wherein the thickness of the substrate protective film is 0.1 μm to 1 μm.

4. The optical glass element manufacturing method of claim 1, wherein the thickness of the surface protective film is 0.005 μm to 0.03 μm.

* * * * *